United States Patent [19]
Wang et al.

[11] Patent Number: 6,013,579
[45] Date of Patent: Jan. 11, 2000

[54] SELF-ALIGNED VIA PROCESS FOR PREVENTING POISON VIA FORMATION

[75] Inventors: Kun-Chih Wang, Tucheng; Tri-Rung Yew, Hsinchu Hsien, both of Taiwan

[73] Assignee: United Microelectronics Corp., Hsinchu, Taiwan

[21] Appl. No.: 09/176,385

[22] Filed: Oct. 21, 1998

[30] Foreign Application Priority Data

Aug. 7, 1998 [TW] Taiwan ................................. 87113021

[51] Int. Cl.$^7$ ..................................................... H01L 21/00
[52] U.S. Cl. .......................... 438/692; 438/734; 438/738; 438/740
[58] Field of Search ..................................... 438/633, 637, 438/672, 692–723, 724, 734, 738, 740, 743, 744, 750, 756, 757; 216/18, 38, 67, 79, 80, 99

[56] References Cited

U.S. PATENT DOCUMENTS 5,783,494  7/1998  Sakurai et al. ....................... 438/738 X

*Primary Examiner*—William Powell
*Attorney, Agent, or Firm*—Hickman Stephens & Coleman, LLP

[57] ABSTRACT

A self-aligned via process to prevent the via poisoning includes forming a hydrogen silsesquioxane layer on the substrate and over a pre-formed metal layer, forming an etching stop layer on the hydrogen silsesquioxane layer, forming an oxide layer on the etching stop layer, and then proceeding with a two-step etching process to form a via. The two-step etching process first patterns the oxide layer using a patterned photoresist layer as a mask, and then patterns the etching stop layer together with the hydrogen silsesquioxane layer using the patterned oxide layer as a mask. Because the etching stop layer prevents the hydrogen silsesquioxane layer from reacting with the oxygen plasma during the photoresist layer removal process, via poisoning is eliminated.

15 Claims, 4 Drawing Sheets

SELF-ALIGNED VIA PROCESS FOR PREVENTING POISON VIA FORMATION

CROSS-REFERENCE TO RELATED APPLICATION

This application claims the priority benefit of Taiwan application Ser. No. 87113021, filed Aug. 7, 1998 the full disclosure of which is incorporated herein by reference.

BACKGROUND OF THE INVENTION

1. Field of the Invention

This invention relates to a process of fabricating metal interconnects, and more particularly, to a self-aligned via process designed to prevent via poisoning 2. Description of Related Art As the integration of an integrated circuit (IC) device is increased, a semiconductor wafer is less able to provide enough surface space for placing needed interconnects. Therefore a design containing more than two metal layers has been applied to fabricating the interconnects of a down-sized metal oxide semiconductor (MOS) transistor. In the design of such a semiconductor device, an inter-metal dielectric (IMD) layer is normally placed between metal layers to prevent unnecessary connections. Furthermore, the degree of planarity of an IMD layer affects the difficulty of the follow-up deposition and etching processes of a metal layer, and the resolution of a photolithography process as well.

Because hydrogen silsesquioxane (HSQ), a spin-on-glass (SOG), has low-permittivity, carbon-free, and reflowable, HSQ has recently been used in the semiconductor fabrication process to prevent pollution during an etching back process. HSQ also has a high gap filling capability, so using HSQ reduces processing steps and lowers production cost. Furthermore, bonding between silicon and hydrogen (Si—H) in the HSQ prevents the HSQ layer from absorbing moisture, so that HSQ is used as the direct-on-metal dielectric for a better planarity and a lower parasitic capacitance. In addition, using a HSQ dielectric layer in a semiconductor fabrication process doesn't require a chemical-mechanical polishing process, so production costs are further lowered.

A conventional fabrication process of a via hole is shown by the cross-sectional diagrams in FIG. 1 through 1E. As referring to FIG. 1A, an IMD layer consisting of a HSQ layer 104 and an oxide layer 106 is formed on a substrate 100 having a pre-formed metal layer 102. The HSQ is first dissolved in a solvent to form a liquid-state dielectric, which is then sprayed on the substrate 100 in a spin coating process. A follow-up flow process planarizs the HSQ layer 104, and a curing process removes the solvent in order to harden the HSQ layer. The oxide layer 106 is formed by plasma-enhanced chemical vapor deposition.

Referring next to FIG. 1B, the oxide layer 106 and the HSQ 104 are patterned to form a via hole 110, and expose the metal layer 102 using a typical photolithography process. The photolithography process includes forming a patterned photoresist layer 108 on the oxide layer 106, and following this with an etching process, using the photoresist layer 108 as a etching mask to form the via hole 110.

Referring to FIG. 1C, the photoresist layer 108 is removed in an oxygen plasma ashing process. She polymer side products of the etching process are also removed by a liquid remover, such as Referring to FIG. 1D, a metal layer 112, such as aluminum or tungsten, is formed on the substrate 100, wherein a typical process for forming, an aluminum layer is physical vapor deposition, and a typical process for forming a tungsten layer is chemical vapor deposition.

Next, referring to FIG. 1E, an etching back or a chemical-mechanical polishing process is performed to remove the metal layer 112 from the top of the oxide layer 106 to form a via 112a, electrically connected to the metal layer 102.

However, referring to FIG. 1C, the HSQ layer 104a exposed through the via hole 110 generates a hydrophilic bond, Si-OH, which absorbs moisture during the oxygen plasma etching process used to remove the photoresist layer 108. And, in the follow-up metal layer deposition, the moisture absorbed by the HSQ layer 104a generates an outgassing effect, which leads to the problem of via poisoning. According to the greatly increased integration of integrated circuits, an unlanded via is used to replace the conventional landed via for efficiently increasing the density of the devices. Any alignment errors in the phlotolithographic via hole patterning process result in an increase in the area of the HSQ layer 104a that is exposed, making the moisture absorbing, problem more serious.

On the other hand, the aspect ratio of the via hole 110 is increased in a highly integrated semiconductor device, and that causes poor step coverage on the metal layer 112. As shown in FIG. 2, the space 113 is caused by poor quality filling.

SUMMARY OF THE INVENTION

It is therefore an objective of the present invention to provide a self-aligned via process to prevent via poisoning. This self-aligned via process prevents the HSQ layer from generating hydrophilic bonds, which absorb moisture in an oxygen plasma etching process which removes the photoresist layer. The invention furthermore avoids the outgassing effect, which causes via poisoning at the via hole in the follow-up fabrication process.

It is another an objective of the present invention to provide a self-aligned via process to prevent via poisoning that provides better step coverage for the fabrication of semiconductor devices with high integration.

In accordance with the foregoing and other objectives of the present invention, a self-aligned via process is provided to prevent via poisoning. This self-aligned via process includes first forming a HSQ layer on a substrate having a preformed metal layer and forming an etching stop layer and then a dielectric layer on the HSQ layer. Then, the steps of patterning the dielectric layer using a photoresist layer as a mask, and then patterning the HSQ layer using the previously patterned dielectric layer as a mask, to expose the underlying, metal layer, are performed in sequence to complete the whole via process. The photoresist layer is removed using oxygen plasma etching. Because the HSQ layer is protected by the etching stop layer during the photoresist layer removal, the HSQ layer is prevented from reacting with the oxygen plasma, and is therefore prevented from making hydrophilic bonds. Therefore, the problems due to via poisoning are avoided. Since the dielectric layer is used as a mask in the second etching process, the corners of the dielectric layer are rounded. Those rounded corners enhance the filling and step coverage of the follow-up deposition process.

In accordance with an embodiment of the invention, the etching rates on the etching, stop layer and the dielectric layer have to be different. So, the etching stop layer includes silicon nitride, silicon-oxy-nitride, or silicon rich oxide, when silicon oxide is used as the dielectric layer. The removal of the photoresist layer is still done by a conventional oxygen plasma etching process. A liquid remover, which doesn't react to the HSQ layer and does not therefore stimulate hydrophilic bonding, is used to remove the polymer side-products produced during the via hole formation etching process.

BRIEF DESCRIPTION OF THE DRAWINGS

The invention can he more fully understood by reading the following detailed description of the preferred embodiments, with reference made to the accompanying drawings, wherein.

DETAILED DESCRIPTION OF PREFERRED EMBODIMENTS

Figure 3A:
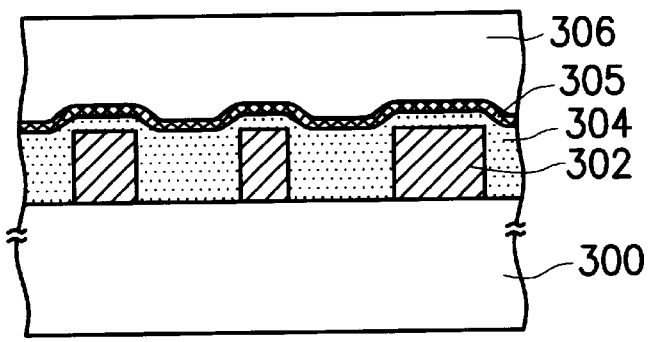
FIG. 3A, 3B, 3C, 3D, 3E and 3F are sectional views showing the unlanded-via process according to the invention.

The invention provides a new via process to prevent via poisoning as shown in FIGS. 3A through 3F. Referring to FIG. 3A, a HSQ layer 304 is formed on the substrate 300 having a pre-formed metal layer 302. Then, a dielectric layer 306 is deposited on the top after an etching stop layer 305 is formed on the HSQ layer. Typically, the HSQ material is first dissolved in a solvent to form a liquid-state dielectric, and the liquid-state dielectric is then sprayed on the substrate 300 in a spin coating process. A follow-up how process is performed to planarize the sprayed HSQ material on the substrate 300, and then a curing process is used to remove the solvent in order to harden the HSQ layer. The etching, rates on the etching stop layer 305 and dielectric layer 306 are different. For example, in the case that the dielectric layer 306 is made of silicon oxide in a plasma enhanced chemical vapor deposition process, the preferred etching stop layer includes silicon nitride, silicon-oxy-nitride, or silicon-rich oxide, formed by chemical vapor deposition.

Figure 3B:
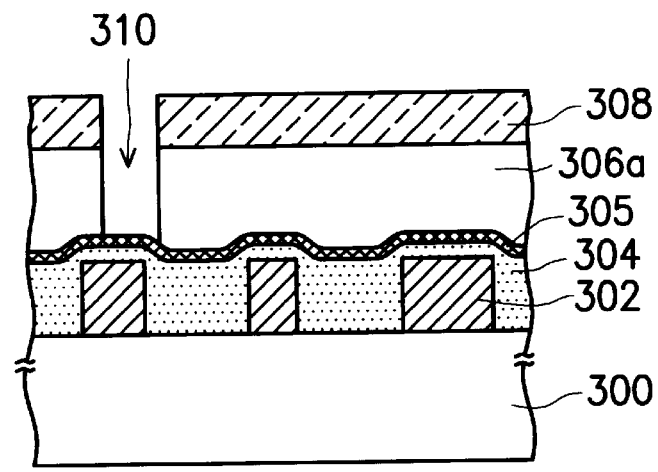

Referring next to FIG. 3B, the via hole opening is then formed on the semiconductor substrate in a two-step process. According to the invention, the via process starts with an etching process on the dielectric layer 306. This first step includes forming a patterned photoresist layer 308 on the dielectric layer 306, and proceeding with the etching process on the dielectric layer 306 using the patterned photoresist layer 308 as a mask to forming the opening 310.

Figure 3C:
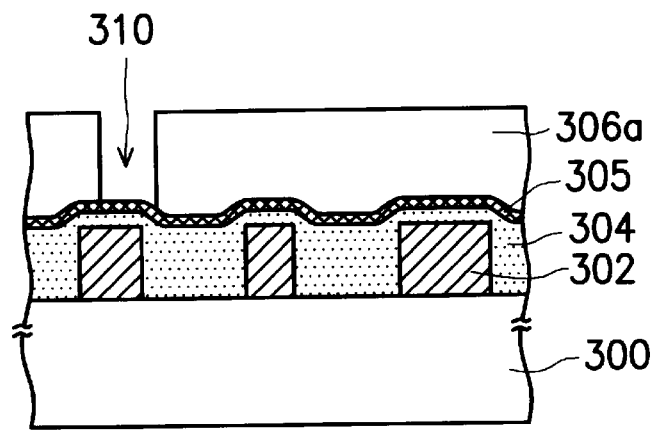

Then, referring to FIG. 3C, the photoresist layer 308 is removed through a typical oxygen plasma etching process to expose the dielectric layer 306a before proceeding with the second step of the via process. Since the exposed etching stop layer 305 within the openings 310 protects the underlying HSQ layer 304 from reacting with the oxygen plasma during the oxygen plasma etching process, the problems resulting from via poisoning caused during the follow-up processes are eliminated.

Figure 3D:
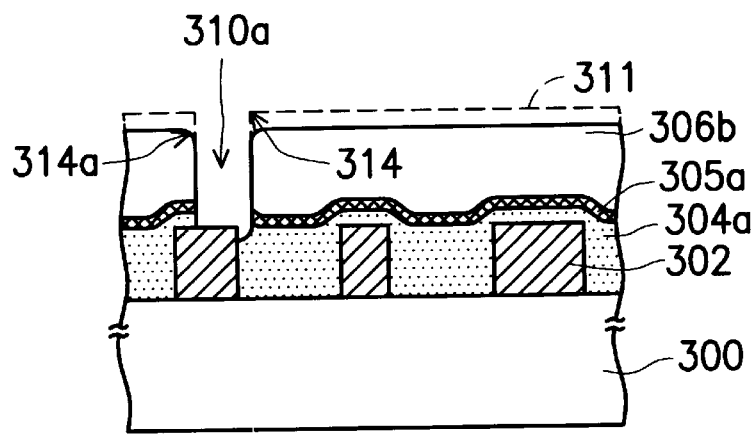

Referring, to FIG. 3D, the second step of the via process is shown. The second step of the via process includes performing an etching process to remove the exposed etching stop layer 305 in the opening 310, and the underlying HSQ layer 304 by using the patterned dielectric layer 306 as an etching mask to form an opening 310a. Then, a liquid remover, which doesn't react to the HSQ layer 304a and therefore does not stimulate hydrophilic bonding, such as is used to remove the polymer side-products produced during the previous etching process. The area surrounded by the dash line 311 represents the portion of the dielectric layer 306a removed after the dielectric layer 306a is used as a mash in an etching process. The corners 314 are also removed to form the rounded corners 314a after the etching process. Those rounded corners 314a promise a better filling and step coverage in the following a metal layer deposition.

Figure 1A:
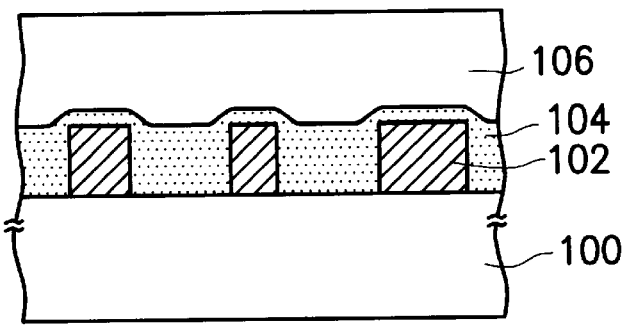
FIGS. 1A, 1B, 1C, 1D and 1E are cross-sectional views showing a conventional via process.
Figure 1B:
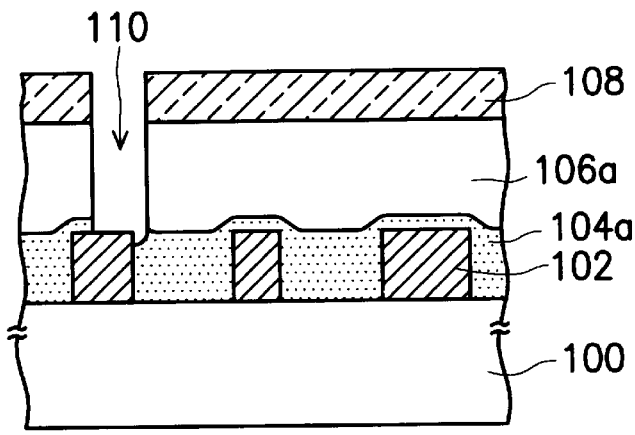
Figure 1C:
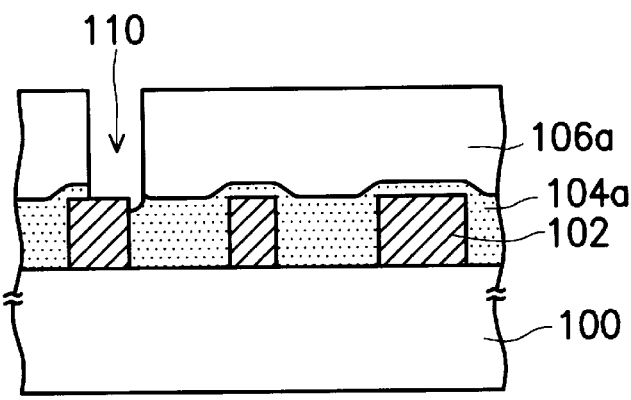
Figure 1D:
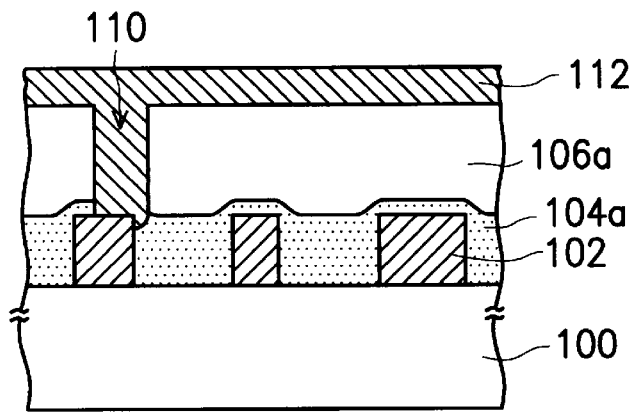
Figure 1E:
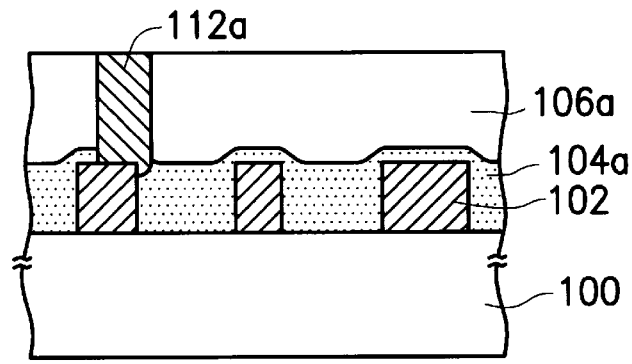
Figure 2:
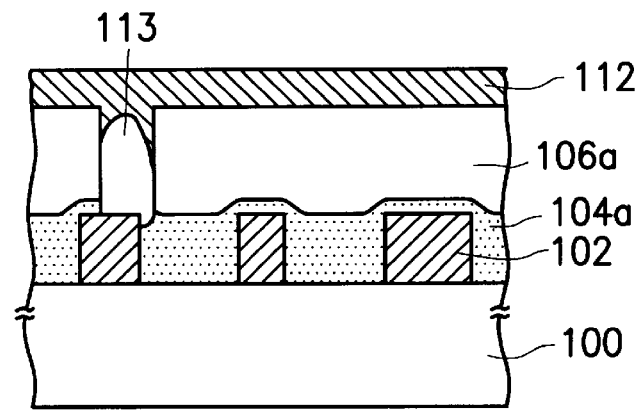
FIG. 2 is a cross-sectional view showing a case of poor quality filling in a metal layer.
Figure 3E:
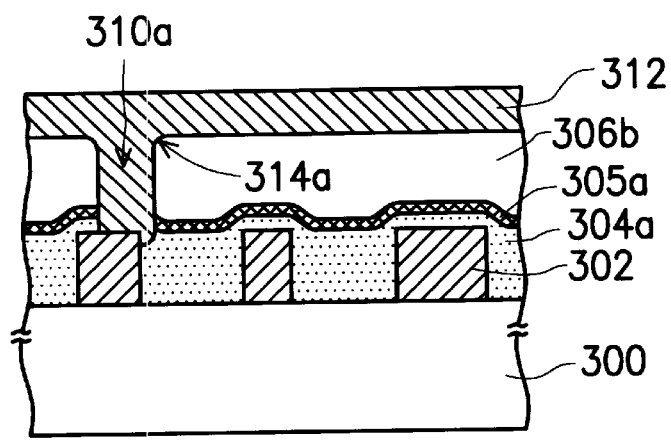
Figure 3F:
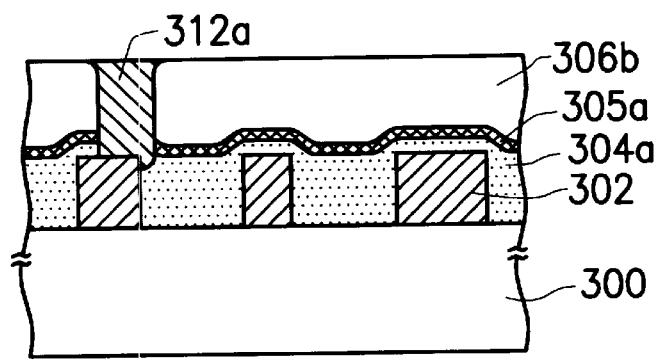

Referring next to FIG. 3E and 3F, metal layer 312 is first formed to cover the dielectric layer 306b and fill the opening 310a. Then, the portion of the metal layer 312 covering the dielectric layer 306b is removed from the top of the dielectric layer 306b to form the via 312a, which is electrically connect to the metal layer 302. The via 312a includes aluminum or tungsten, wherein an aluminum via is formed through physical vapor deposition, and a tungsten via is formed through chemical vapor deposition. Because the rounded corners 314a promise better filling and step coverage on the formation of the metal layer 312, the poor quality filling of the conventional via process, shown FIG. 2, can be avoided.

According to the foregoing, it is a specificity of the invention to use an etching stop layer to prevent the HSQ layer from reacting to the oxygen plasma during a photoresist layer removal etching process. Via poisoning, caused by the outgassing effect in a follow-up process wherein a reaction between the HSQ layer and oxygen plasma stimulates hydrophilic bonding, can be eliminated.

It is another specificity of the invention that the increasing the exposed area of the HSQ layer due to an alignment error in the photolithography process for patterning the via does not cause any problem because the process according to the invention eliminates via poisoning.

It is still another specificity of the invention to use the dielectric layer as a mask in an etching process in the second step of the via process. The rounded corners of the dielectric layer formed after the etching process promise better filling and step coverage for the subsequent metal layer deposition.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A self-aligned via process for preventing via poisoning performed on a semiconductor substrate having a first metal layer, comprising;

forming a hydrogen silsesquioxane layer on the semiconductor substrate;

forming a etching stop layer on the hydrogen silsesquioxane layer;

forming a dielectric layer on the etching stop layer;

forming a patterned photoresist layer on the dielectric layer;

performing an etching process on the dielectric layer to form an opening, using the patterned photoresist layer as a mask and the etching stop layer as a etching stop;

removing the patterned photoresist layer;

performing an etching process on the etching stop layer and the hydrogen silsesquioxane layer to form a via hole to expose the metal layer beneath by using the dielectric layer as a mask;

using a liquid remover to remove polymer side-products created during the etching processes; and filling the via hole with a second metal layer to form the via.

2. The process of claim 1, wherein the etching stop layer and the dielectric layer have different etching rates.

3. The process of claim 2, wherein the dielectric layer comprises silicon oxide.

4. The process of claim 3, wherein the etching stop layer comprises silicon nitride, silicon-oxy-nitride, or silicon-rich oxide.

5. The process of claim 1, wherein the patterned photoresist layer is removed by an oxygen plasma etching process.

6. The process of claim 1, wherein a plurality of corners on the dielectric layer are rounded after being used as a mask.

7. The process of claim 1, wherein the liquid remover does not react to the hydrogen silsesquioxane layer to cause hydrophilic bonding.

8. The process of claim 1 further comprising an etching, back process.

9. The process of claim 1 further comprising a chemical-mechanical polishing process.

10. A self-aligned via process for preventing via poisoning performed on a semiconductor substrate having a first metal layer, comprising;

forming a hydrogen silsesquioxane layer on the semiconductor substrate;

forming an etching stop layer on the hydrogen silsesquioxane layer;

forming an oxide layer on the etching stop layer;

forming a patterned photoresist layer on the oxide layer;

performing an etching process on the oxide layer to form an opening, using the patterned photoresist layer as a mask and the etching stop layer as a etching stop;

removing the patterned photoresist layer with an oxygen plasma etching process;

performing an etching process on the etching stop layer and the hydrogen silsesquioxane layer to form via hole to expose the underlying metal layer and remove a plurality from corners of the oxide layer, using the oxide layer as a mask;

using a liquid remover to remove polymer side-products created during the etching processes; and filling the via hole with a second metal layer to form the via.

11. The process of claim 10, wherein the etching stop layer and the oxide layer have different etching rates.

12. The process of claim 11, wherein the etching stop layer comprises silicon nitride, silicon-oxy-nitride, or silicon-rich oxide.

13. The process of claim 10, wherein the liquid remover does not react to the hydrogen silsesquioxane layer to cause hydrophilic bonding.

14. The process of claim 1, further comprising an etching hack process.

15. The process of claim 10, further comprising a chemical-mechanical polishing process.

* * * * *